United States Patent [19]

Moriyasu et al.

[11] Patent Number: 4,464,589

[45] Date of Patent: Aug. 7, 1984

[54] IL BUFFER HAVING HIGHER BREAKDOWN LEVELS

[75] Inventors: Toshinori Moriyasu, Chigasaki; Masanori Nakai, Ebina, both of Japan

[73] Assignee: Tokyo Shibaura Denki Kabushiki Kaisha, Japan

[21] Appl. No.: 405,272

[22] Filed: Aug. 4, 1982

[30] Foreign Application Priority Data

Aug. 17, 1981 [JP] Japan ................... 56-128449

[51] Int. Cl.³ ................... H03K 19/091; H03K 17/08; H03K 17/10; H03K 19/003

[52] U.S. Cl. ................... 307/477; 307/254; 307/270; 307/299 B

[58] Field of Search ........... 307/475, 459, 466, 299 B, 307/299 R, 270, 477, 254, 255, 264, 407, 410, 412

[56] References Cited

U.S. PATENT DOCUMENTS 3,937,987 2/1976 Ahmed ................ 307/254 X
4,390,802 6/1983 Woltz ................ 307/477 X

FOREIGN PATENT DOCUMENTS 2907597 9/1979 Fed. Rep. of Germany ... 307/299 B
8027686 12/1982 France ................ 307/475
47-57686 12/1972 Japan ................ 307/455

OTHER PUBLICATIONS

Maddox, "A High Voltage Transistor Switching Circuit", Technical Digest, No. 44, pp. 37-38, Oct. 1976.

Primary Examiner—Larry N. Anagnos
Assistant Examiner—David R. Bertelson
Attorney, Agent, or Firm—Finnegan, Henderson, Farabow, Garrett & Dunner

[57] ABSTRACT

A buffer circuit is provided wherein bipolar transistors are connected to the output terminal of an IIL gate. The buffer circuit includes an IIL gate having a plurality of output terminals. The output terminals of the IIL gate are respectively connected to the bases of the bipolar transistors of which the emitter-collector paths are connected in series between a buffer output terminal and a reference voltage terminal.

5 Claims, 6 Drawing Figures

F I G. 2
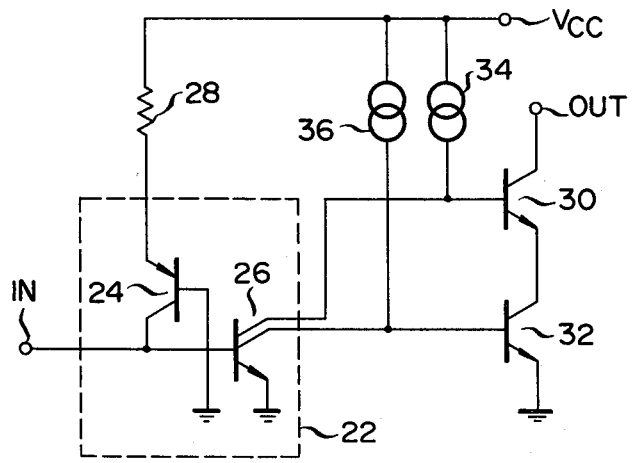

IL BUFFER HAVING HIGHER BREAKDOWN LEVELS

BACKGROUND OF THE INVENTION

The present invention relates to a buffer circuit using an IIL (integrated injection logic) gate.

An IIL gate has been developed in recent years as a bipolar element which can be highly integrated. FIG. 1 shows a circuit diagram of the conventional buffer circuit using an IIL gate. The output of the IIL gate 10 is supplied to the output terminal OUT through an output circuit including NPN transistors 12 and 14. That is, the output terminal of the IIL gate 10 is connected to the base of the transistor 12 which has its emitter connected to the base of the transistor 14. The emitter of the transistor 12 is grounded through a resistor 16, while the emitter of the transistor 14 is directly grounded. The collector of the transistor 14 is connected to the output terminal OUT. The base and the collector of the transistor 12 are connected to a power source VCC respectively through resistors 18 and 20.

In the buffer circuit as described above, when the input terminal IN of the IIL gate 10 is at logic "1" level, the logic level of the output terminal of the IIL gate 10 becomes "0", and the transistor 12 is turned off, the logic level at the output terminal OUT being made "1". Contrary to this, if the input terminal IN is at logic "0" level, the transistors 12 and 14 are turned on and the output terminal is at logic "0" level. Thus, the input level appears at the output terminal OUT so that this circuit operates as a buffer circuit.

The power source VCC is ordinarily low (5 through 12 V), however, the output terminal OUT can be impressed by a higher voltage than the power source VCC since OUT is an open collector output. The voltage capable of being impressed upon the output terminal OUT is determined by the breakdown voltage between the collector and the emitter of the transistor 14. Therefore, it is necessary to make the breakdown voltage of the transistor 14 higher than usual. The breakdown voltage of the transistor 14 is determined by $V_{CER}$ (the collector voltage of the transistor, wherein the emitter is grounded and connected to the base through a resistor). The $V_{CER}$ is affected by the current amplification factor and the resistance between the base and the emitter, and comes down to $V_{CEO}$ (the collector voltage in a case in which the emitter is grounded and the base is open) at the worst making it difficult to control. Further, when the buffer circuit is integrated on a chip, it is necessary to increase the impurity density of the epitaxial layer and make the thickness of it thin for increasing the operation speed of the IIL gate and fan-out. On the contrary, this reduces $V_{CER}$ of the transistor 14. Therefore, in the conventional buffer circuit using the IIL gate, it becomes necessary to reduce the integration density and the operation speed of the IIL gate for increasing the breakdown voltage of the output bipolar transistor.

SUMMARY OF THE INVENTION

It is an object of the present invention, in a buffer circuit comprising an IIL gate and output bipolar transistors, to increase the breakdown voltage of the output transistors when the output terminal is at logic "true" level without lowering the integration degree and the operation speed of the IIL gate.

The object can be realized by a buffer circuit comprising an IIL gate having a plurality of output terminals, a plurality of bipolar transistors the bases of which are connected to the output terminals of the IIL gate, respectively, the emitter-collector paths of the transistors being connected in series between a buffer output terminal and a reference voltage terminal, and a plurality of current sources connected to the bases of the bipolar transistors, respectively.

BRIEF DESCRIPTION OF THE DRAWINGS

FIG. 2 shows a circuit diagram of an embodiment of a buffer circuit according to the present invention;

DETAILED DESCRIPTION OF THE PREFERRED EMBODIMENT

Figure 1:
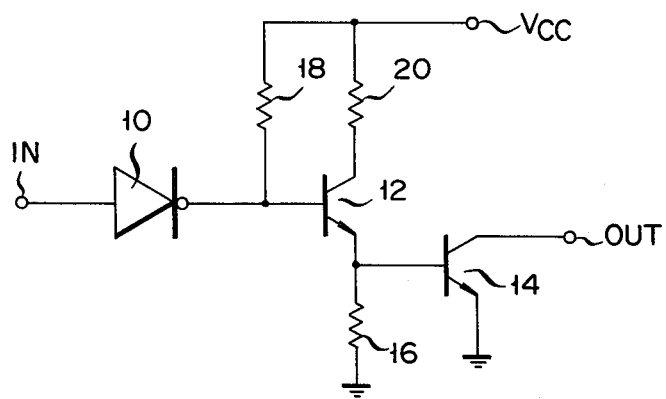
FIG. 1 shows a circuit diagram of a conventional buffer circuit using an IIL gate.

An embodiment of a buffer circuit according to the present invention will be described with reference to the accompanying drawings. An IIL gate 22 is comprised of a PNP injector transistor 24 and an NPN inverter transistor 26. The inverter transistor 26 is a multicollector transistor, that is the IIL gate 22 has two output terminals. An input terminal IN is connected to the collector of the transistor 24 and the base of the transistor 26. The emitter of the transistor 24 is connected to a power source VCC through a resistor 28. The base of the transistor 24 and the emitter of the transistor 26 are grounded. The collectors of the transistor 26 are connected respectively to the bases of output transistors 30 and 32 and to the power source VCC respectively through constant current sources 34 and 36. The collector of the transistor 30 is connected to the buffer output terminal OUT, the emitter of it being connected to the collector of transistor 32 of which the emitter is grounded.

The operation of the embodiment will be described in the following.

When the input terminal is at the logic "0" level, the transistor 26 is off so that the transistors 30 and 32 are on and the output terminal OUT is at logic "0" level. When the input terminal is at logic "1" level, the transistors 30 and 32 are off, so the output terminal is at logic "1" level. When the transistors 30 and 32 are off, if the voltage of the output terminal OUT is increased to a certain value, either the transistors 30 and 32 are broken down or only transistor 30 is broken down. The voltage limit (breakdown voltage) is set as described below. Since transistor 26 is on, the bases of the transistors 30 and 32 are considered to be in a base-grounded state. The transistor 32 is in an equivalent state so that the base-emitter path is shorted, since the base and the emitter are at nearly the same potential. Thus, the emitter of the transistor 30 is grounded through a high impedance element. The transistors 30 and 32 will break down if the voltage at the output terminal OUT becomes higher than the sum of $V_{CES}$ of the transistors 30 and 32, where $V_{CES}$ is the voltage between the emitter and the collector when the emitter is grounded and the base-emitter path is shorted. If the voltage at the output terminal OUT becomes higher than $BV_{CBO}$ (breakdown voltage between the base and the collector) of the transistor 30, it breaks down. According to this embodiment, the breakdown voltage of the output transistors is $2V_{CES}$ or $BV_{CBO}$ whichever is lower. Generally, since $V_{CER} \leq V_{CES} \leq BV_{CBO}$, the breakdown voltage of the output transistors is made higher than that in the conventional buffer circuit shown in FIG. 1. If the circuit shown in FIG. 2 is set up by providing the transistor with an epitaxial layer having an impurity density of $10^{16}$ through $10^{17}$ atm/cm$^3$ and a thickness of 4 through 8 μm, $BV_{CBO}$ and $V_{CEO}$ respectively become 25 through 40 V and 8 through 12 V. Thus, the above requirement is fully met and the operation speed and the integration degree of the IIL gate are not lowered at all because of the high density and thin thickness of the epitaxial layer. Further, $BV_{CBO}$ does not depend on the current amplification factor, the emitter resistance, etc., but depends only on the impurity density of the collector so that the breakdown voltage is controllable.

As described above, according to this embodiment, in the buffer circuit comprising the IIL gate and output transistors, the breakdown voltage of the output transistors can be made higher without lowering the characteristic of the IIL gate by providing the IIL gate with a plurality of output terminals and by using a plurality of output transistors having their bases respectively connected to the output terminals of the IIL gate and their emitter-collector paths connected in series between the buffer output terminal and the reference voltage terminal.

When the output terminal of the IIL gate 22 is at a logic "1" level, the base voltage of the transistor 32 becomes $V_{BE}(Q32)$ and the base voltage of the transistor 30 is to be $V_{CE(sat)}(Q32)+V_{BE}(Q30)$, where $V_{BE}$ is the voltage between the base and the emitter, $V_{CE}(sat)$ being the voltage between the collector and the emitter in saturation. In some cases, the base of the transistor 30, i.e., the output terminal of the IIL gate 22 attains a value of VCC, until the transistors 30 and 32 are completely on, after the logic level of the output terminal of the IIL gate 22 becomes "1", because the base of the transistor 30 is driven by a constant current. However, the inverter transistor 26 of the IIL gate 22 is operating at an upward state, therefore, its $V_{CEO}$ is low in principle so that the transistor 26 will break down.

Figure 3:
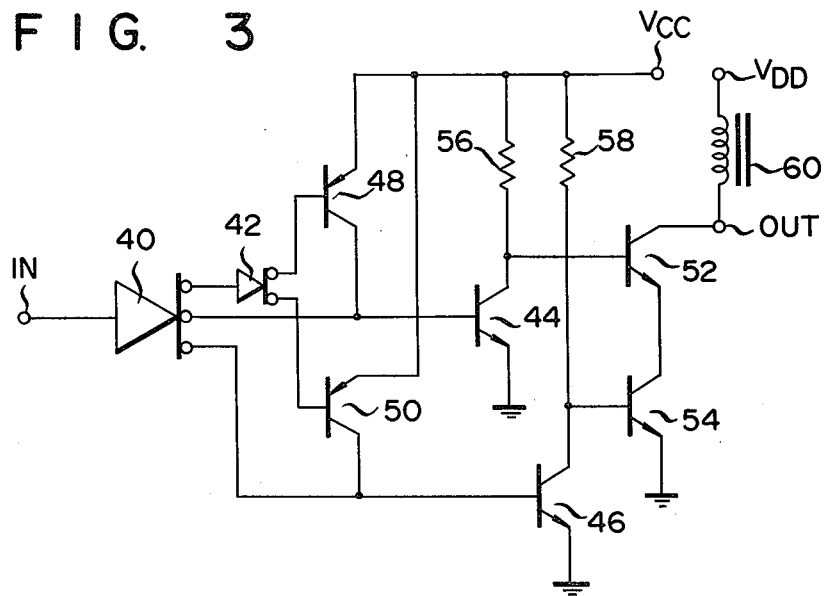
FIG. 3 is a circuit diagram of a second embodiment of a buffer circuit according to the present invention.

Hereinafter, another embodiment considering the above described will be given. FIG. 3 is a circuit diagram of the second embodiment of the present invention. In FIG. 3, an IIL gate 40 has three output terminals, which are respectively connected to the input terminal of an IIL gate 42, the base of an NPN transistor 44 and the base of an NPN transistor 46. The IIL gate 42 is provided with two output terminals which are respectively connected to the base of a PNP transistor 48 and the base of a PNP transistor 50. The emitters of the transistors 48 and 50 are connected to a power source VCC (of 1.5 through 2.4 Volts) and the collectors of the transistors 48 and 50 are respectively connected to the bases of the transistors 44 and 46. The emitters of transistors 44 and 46 are grounded. The collectors of the transistors 44 and 46 are respectively connected to the bases of NPN transistors 52 and 54 and to the power source VCC through respective resistors 56 and 58. The collector of the transistor 52 is connected through the buffer output terminal OUT to one end of an electromagnetic coil 60 as a load, while its emitter is connected to the collector of the transistor 54 which has its emitter grounded. This embodiment is used, for example, to control a focal plane shutter of a camera. The o52 and 54 are on, the electromagnetic coil 60 is thus made conductive. When the input terminal IN is at logic "0" level, the transistors 48, 50, 44 and 46 are on, while the transistors 52 and 54 are off, and the electromagnetic coil 60 is made nonconductive. In this case, the output potential of the IIL gate 40 never increases higher than $V_{BE}+V_{CE(sat)}$, while the output potential of the IIL gate 42 does not increase higher than $V_{BE}$ so that the inverter transistors of IIL gates 40 and 42 do not break down. When the logic level of the input terminal IN is set at "0", the transistor 48, 50, 44 and 46 are on, the transistors 52 and 54 are off, and the electromagnetic coil 60 is made nonconductive. Since the output terminal OUT is connected to the electromagnetic coil 60, the potential at OUT would increase to infinite value for a moment due to a counter electromotive force of the coil 60 when the transistors 52 and 54 are made off. However, from a practical standpoint the potential of OUT increases only to the breakdown voltage of the transistors 52 and 54. Therefore, any energy caused by the counter electromotive force of the coil 60 can not be discharged in an instant and a counter current flows through the coil 60 during a certain period. The timing for making the electromagnetic coil 60 nonconductive lags a little behind the timing when the logic level at the input terminal IN changes. The higher the breakdown voltage of the transistors 52 and 54 is, the quicker the energy due to the counter electromotive force is discharged after the transistors 52 and 54 are off. Thus, the period in which the counter current flows is made shorter, therefore, time lag of timing can be a little.

Figure 4:
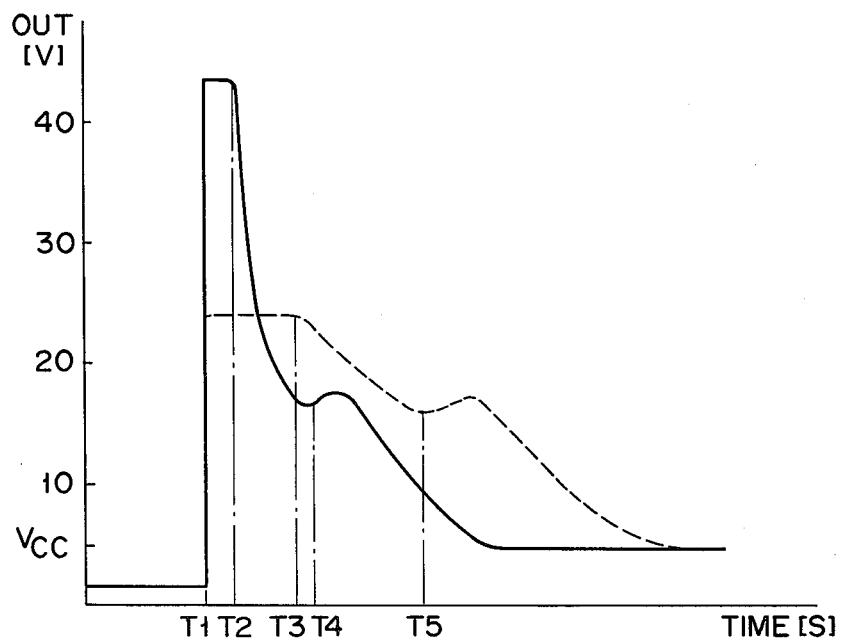
FIG. 4 is a graph showing the effect of the second embodiment of a buffer circuit according to the present invention against the conventional buffer circuit.

The operation described above is shown in FIG. 4, wherein the voltage V of the output terminal is taken on the axis of the ordinate, and time being on the axis of the abscissa. The characteristic of the embodiment shown in FIG. 3 is shown by a solid line, while that in the case where the electromagnetic coil is connected to the buffer output terminal in the conventional circuit of FIG. 1 is shown by a broken line. At T<T1, the transistors 52 and 54 are on and the electromagnetic coil 60 is conductive. When T=T1, the transistors 52 and 54 are off, and a counter electromotive force is generated by the coil 60 when T>T1. In the conventional embodiment, the breakdown is caused at nearly 25 V, lasting to T3, and at T5 the level of the counter current of the coil 60 decreases. The coil 60 is turned off. On the contrary, in the present embodiment the breakdown is caused at about 45 V, lasting to T2. At T4 the counter current of the electromagnetic coil 60 becomes small like at T5 in the conventional embodiment. Thus, according to the present embodiment, transient response time (T1<T<T4) to the off state from the on state of the electromagnetic coil 60 is made about half compared with that (T1<T<T5) in the conventional circuit shown in FIG. 1.

Figure 5:
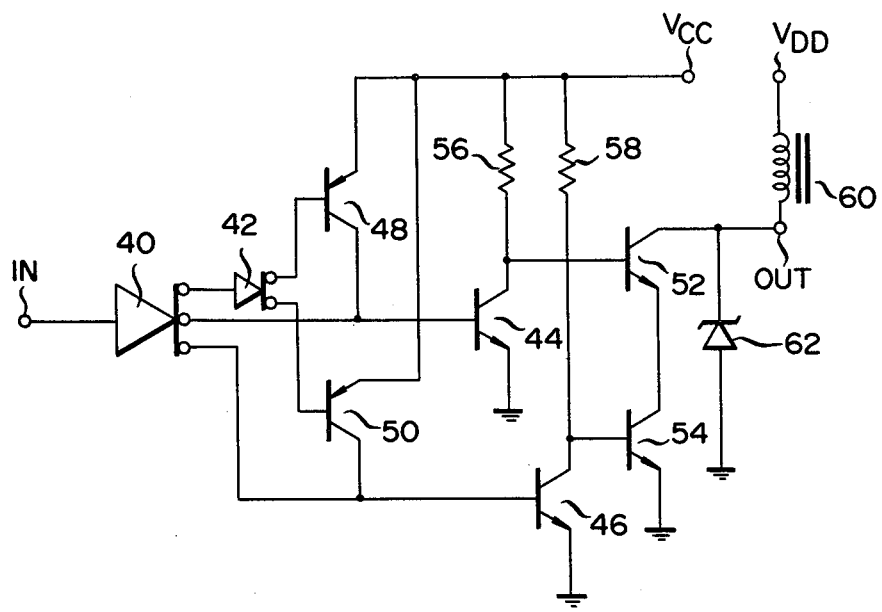
FIG. 5 is a circuit diagram of a modification of the second embodiment shown in FIG. 3.

FIG. 5 shows a modified one of the second embodiment wherein a zener diode 62 is connected in parallel to the transistor 52 and 54 for protecting these transistors from breakdown. The zener voltage of the zener diode 62 in this case is set a little lower than the sum of $BV_{CBO}$ of the transistors 52 and 54.

Figure 6:
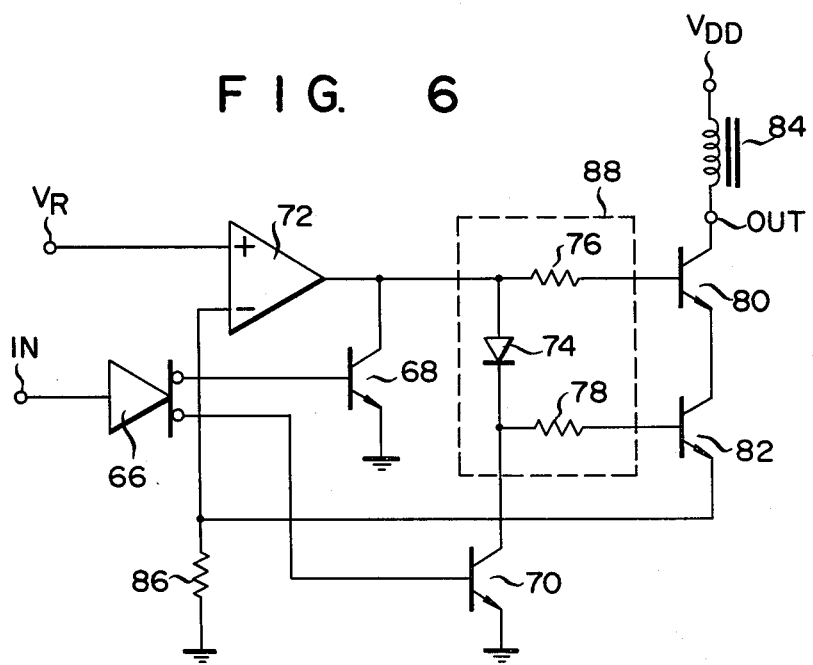
FIG. 6 is a circuit diagram of a third embodiment of the present invention.

FIG. 6 is a circuit diagram of a third embodiment of the present invention.

The output terminals of an IIL gate 66 are respectively connected to the bases of NPN transistors 68 and 70. The emitters of the transistors 68 and 70 are grounded. The collectors of the transistors 68 and 70 are respectively connected to the output terminal of an operational amplifier 72 and the cathode of a diode 74. The anode and the cathode of the diode 74 are respectively connected to the bases of transistors 80 and 82 through respective resistors 76 and 78. The diode 74 and resistors 76 and 78 constitute a bias circuit 88. The output terminal of the operational amplifier 72 is connected to the anode of the diode 74. The collector of the transistor 80 is connected to one terminal of an electromagnetic coil 84 through the buffer output terminal OUT. The other end of the electromagnetic coil 84 is connected to the power source VDD. The emitter of the transistor 80 is connected to the collector of the transistor 82 which has its emitter connected to the inverting input terminal of the operational amplifier 72 as well as to ground through a resistor 86. The noninverting input terminal of the operational amplifier 72 is connected to the reference voltage terminal VR.

The operation of the third embodiment will be described below. When the input terminal IN of the IIL gate 66 is at logic "1" level, the transistors 68 and 70 are off. Accordingly, the transistors 80 and 82 are made conductive by the bias circuit 88. The emitter voltage of the transistor 82 is fed back to the inverting input terminal of the operational amplifier 72, and is equal to the reference voltage VR. Therefore, a constant current IC=VR/R flows through the resistor 86, where R is the resistance of the resistor 86. If the current amplification factor of the transistors 80 and 82 is sufficiently large, the constant current IC also flows through the electromagnetic coil 84. Therefore, a certain electromagnetic force is generated from the electromagnetic coil 84 for stabilizing the control of the subject. When the input terminal IN of the IIL gate 66 is at the logic "0" level, the transistors 68 and 70 are on and the transistors 80 and 82 are off, resulting in the nonconductive state of the electromagnetic coil 84.

As described above, in the buffer circuit using an IIL gate according to the present invention, the breakdown voltage of the bipolar transistors of the output stage is increased without lowering the feature of the IIL gate. The present invention is not limited to the embodiments described above. The present invention can be modified through changing the number of the transistors of the output stage connected in series or in other ways.

What we claim is:

1. A buffer circuit comprising:
   an IIL (integrated injection logic) gate having a plurality of output terminals;
   a plurality of bipolar transistors the bases of which are connected to the output terminals of said IIL gate, respectively, the emitter-collector paths of said transistors being connected in series between a buffer output terminal and a reference voltage terminal; and
   current source means connected to the bases of said transistors.

2. A buffer circuit according to claim 1, in which the output terminals of said IIL gate are connected to respective bases of said transistors respectively through the base-collector paths of transistors having their emitters grounded.

3. A buffer circuit according to claim 2, in which the buffer output terminal is connected to an inductive element and to the reference voltage terminal through a zener diode of which the zener voltage is set at a voltage less than the sum of the combined $BV_{CBO}$ of said bipolar transistors wherein said $BV_{CBO}$ is the reverse breakdown voltage between the base and collector of the individual bipolar transistors.

4. A buffer circuit according to claim 1, in which said current source means is a constant current source.

5. A buffer circuit according to claim 2 or 3, in which said current source means is a resistance load.

* * * * *